United States Patent
Muto et al.

(10) Patent No.: US 11,581,471 B2
(45) Date of Patent: Feb. 14, 2023

(54) CHIP OF THERMOELECTRIC CONVERSION MATERIAL

(71) Applicant: LINTEC CORPORATION, Itabashi-ku (JP)

(72) Inventors: Tsuyoshi Muto, Saitama (JP); Kunihisa Kato, Warabi (JP); Taku Nemoto, Mitaka (JP); Wataru Morita, Saitama (JP); Yuta Seki, Kawasaki (JP)

(73) Assignee: LINTEC CORPORATION, Itabashi-ku (JP)

( * ) Notice: Subject to any disclaimer, the term of this patent is extended or adjusted under 35 U.S.C. 154(b) by 14 days.

(21) Appl. No.: 17/282,047

(22) PCT Filed: Oct. 2, 2019

(86) PCT No.: PCT/JP2019/038914
§ 371 (c)(1),
(2) Date: Apr. 1, 2021

(87) PCT Pub. No.: WO2020/071424
PCT Pub. Date: Apr. 9, 2020

(65) Prior Publication Data
US 2021/0391523 A1 Dec. 16, 2021

(30) Foreign Application Priority Data
Oct. 5, 2018 (JP) .............................. JP2018-190442

(51) Int. Cl.
*H01L 35/34* (2006.01)
*H01L 35/32* (2006.01)

(52) U.S. Cl.
CPC .............. *H01L 35/34* (2013.01); *H01L 35/32* (2013.01)

(58) Field of Classification Search
CPC ................................ H01L 35/32; H01L 35/34
See application file for complete search history.

(56) References Cited

U.S. PATENT DOCUMENTS

2012/0060887 A1 * 3/2012 Kim ........................ H01L 35/32
438/54

FOREIGN PATENT DOCUMENTS

| JP | H09321350 A | * 12/1997 |
| JP | 10-229223 A | 8/1998 |
| JP | 2005-191431 A | 7/2005 |
| JP | 2016-6827 A | 1/2016 |
| JP | 2017-204550 A | 11/2017 |
| WO | WO 2016/104615 A1 | 6/2016 |

OTHER PUBLICATIONS

JPH09321350A, Machine Translation, Momoi (Year: 1997).*
International Search Report dated Dec. 10, 2019 in PCT/JP2019/038914 filed on Oct. 2, 2019, 2 pages.

* cited by examiner

*Primary Examiner* — Devina Pillay
(74) *Attorney, Agent, or Firm* — Oblon, McClelland, Maier & Neustadt, L.L.P.

(57) ABSTRACT

A chip of thermoelectric conversion material may have a concave portion and may be capable of realizing high joining properties to an electrode. Such a chip of thermoelectric conversion material may have a concave on at least one surface of the chip of thermoelectric conversion material. The shape of such chips of may be rectangular parallelepiped, cubic, and/or columnar shape.

6 Claims, 2 Drawing Sheets

CHIP OF THERMOELECTRIC CONVERSION MATERIAL

TECHNICAL FIELD

The present invention relates to a chip of thermoelectric conversion material.

BACKGROUND ART

As one of effective usage means of energy, there have hitherto been devices for undergoing direction interconversion between thermal energy and electric energy due to thermoelectric conversion module having a thermoelectric effect, such as the Seebeck effect and the Peltier effect.

Above all, use of a so-called n-type thermoelectric conversion device is known as the thermoelectric conversion device. The n-type is typically constituted in a manner that a pair of electrodes spaced apart from each other is provided on a substrate, and for example, a P-type thermoelectric element is provided on one of the electrodes, and an N-type thermoelectric element is provided on the other electrode, such that the elements are similarly spaced apart from each other, and the upper surfaces of the both thermoelectric elements are joined to an electrode of an opposing substrate.

In recent years, there has been a demand for an improvement in thermoelectric performance including a reduction in thickness and high integration of thermoelectric conversion devices. PTL 1 discloses a method of forming a pattern of a thermoelectric element layer directly by the screen printing method or the like by using a thermoelectric semiconductor composition containing a resin and the like, including the viewpoint of thinning by film thinning, as a thermoelectric element layer.

CITATION LIST

Patent Literature

PTL 1: WO 2016/104615 A

SUMMARY OF INVENTION

Technical Problem

However, in a method of forming a thermoelectric element as a pattern layer directly on an electrode or a substrate by the screen printing method or the like by using a thermoelectric semiconductor composition composed of a thermoelectric semiconductor material, a heat-resistant resin, and so on as disclosed in PTL 1, the shape controllability of the obtained thermoelectric element layer is not sufficient, and bleeding occurs at the end of the thermoelectric element layer on the electrode interface or the substrate interface, whereby the shape of the thermoelectric element layer may occasionally collapse. For example, in the case where it is contemplated to form the shape of the thermoelectric element layer in a rectangular parallelepiped shape (inclusive of a cubic shape) from the viewpoint of thermoelectric performance and easiness of production, a cross-sectional shape of the actual thermoelectric element layer becomes approximately semi-elliptical or trapezoidal (see FIG. 2(a) as mentioned later). Thus, not only the desired thickness is not obtained, but also it is not possible to control the both ends of the region of the upper surface of the thermoelectric element layer to a uniformly flat shape, so that the joining material layer may occasionally go around to the non-flat surfaces of the both ends. For this reason, in the case of constituting the aforementioned n-type thermoelectric conversion device, the area of the joining part between the upper surface of the obtained thermoelectric element layer and the opposing electrode cannot be sufficiently secured, and the joining properties are not sufficient, and the interface resistance and the thermal resistance increase, whereby the thermoelectric performance is lowered, and the thermoelectric performance which the thermoelectric element layer originally possesses may not be satisfactorily brought out. In this way, on the occasion of forming the thermoelectric element layer, it is important to improve the shape controllability of the individual thermoelectric element layers from the viewpoint of improvement of the thermoelectric performance and high integration.

In view of the aforementioned problem, a problem of the present invention is to provide a chip of thermoelectric conversion material having a concave and capable of realizing high joining properties to an electrode.

Solution to Problem

In order to solve the aforementioned circumstances, the present inventors made extensive and intensive investigations. As a result, it has been found that in a chip of thermoelectric conversion material having a concave on at least one surface of the chip of thermoelectric conversion material (the chip will be hereinafter referred to simply as "chip" or "thermoelectric conversion material layer"), when a joining material layer is filled in the concave, high joining properties relative to an electrode can be realized, thereby leading to accomplishment of the present invention.

Specifically, the present invention provides the following (1) to (7).

(1) A chip of thermoelectric conversion material having a concave on at least one surface of the chip of thermoelectric conversion material.

(2) The chip of thermoelectric conversion material as set forth in the above (1), wherein the shape of the chip of thermoelectric conversion material is at least one selected from a rectangular parallelepiped shape, a cubic shape, and a columnar shape.

(3) The chip of thermoelectric conversion material as set forth in the above (1) or (2), wherein in a longitudinal section including a central part in the width direction of the chip of thermoelectric conversion material, when the area of the longitudinal section is defined as S ($\mu m^2$), a maximum value of the thickness in the thickness direction of the longitudinal section is defined as Dmax ($\mu m$), a maximum value of the length in the width direction of the longitudinal section is defined as Xmax ($\mu m$), and a maximum value of the depth of the concave of the longitudinal section is defined as Tmax (urn), the cross section of the concave of the longitudinal section of the chip of thermoelectric conversion material is satisfied with the following requirement (A) and requirement (B):

$$0 < (Dmax \times Xmax - S)/(Dmax \times Xmax) \leq 0.20 \quad (A)$$

$$0.01 < Tmax/Dmax < 0.30 \text{ and } Tmax \geq 2 \; \mu m \quad (B)$$

wherein, in the longitudinal section of the chip of thermoelectric conversion material, the maximum value Dmax of the thickness in the thickness direction of the longitudinal section means a maximum distance (thickness) between two points of intersection obtained on the occasion when in standing a perpendicular line on the bottom of the longitudinal section, the top and bottom ends of the thickness in the thickness direction of the longitudinal section intersect with the perpendicular line; the maximum value Xmax of the length in the width direction of the longitudinal section means a maximum distance (length) between two points of intersection obtained on the occasion when in drawing a parallel line parallel to the bottom of the longitudinal section, the left and right ends of the length in the width direction of the longitudinal section intersect with the parallel line; and the maximum value Tmax of the depth of the concave of the longitudinal section means a maximum distance (depth) obtained by subtracting a shortest distance (length) between a deepest part of the concave and a point of intersection obtained on the occasion of dropping a perpendicular line on the bottom of the longitudinal section from the deepest part of the concave, from the maximum value Dmax of the thickness in the thickness direction of the longitudinal section.

(4) The chip of thermoelectric conversion material as set forth in any of the above (1) to (3), having a joining material layer in the concave of the chip of thermoelectric conversion material.

(5) The chip of thermoelectric conversion material as set forth in any of the above (1) to (4), wherein the joining material layer is formed of a solder material, a conductive adhesive, or a sintered joining agent.

(6) The chip of thermoelectric conversion material as set forth in any of the above (1) to (5), wherein the requirement (A) is $0.05<(Dmax \times Xmax - S)/(Dmax \times Xmax) \leq 0.10$; and the requirement (B) is $0.10<Tmax/Dmax<0.20$ and $4 \leq Tmax \leq 35$ μm.

(7) A thermoelectric conversion module including the chip of thermoelectric conversion material as set forth in any of the above (1) to (6).

Advantageous Effects of Invention

In accordance with the present invention, it is possible to provide a chip of thermoelectric conversion material having a concave and capable of realizing high joining properties to an electrode.

DESCRIPTION OF EMBODIMENTS

Figure 1:
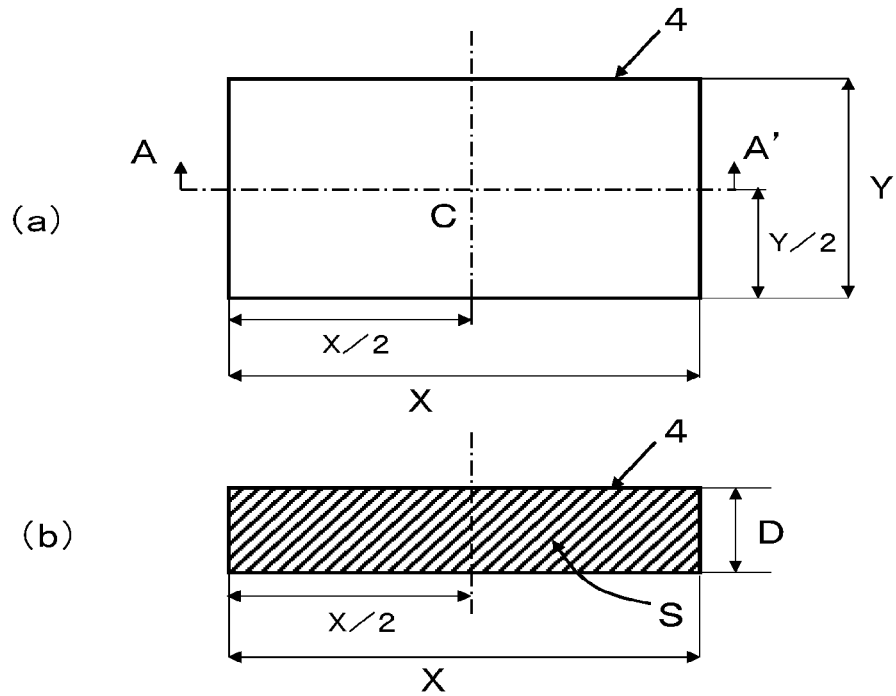
FIG. 1 is a view for explaining the definition of a longitudinal section of the chip of thermoelectric conversion material of the present invention.

[Chip of Thermoelectric Conversion Material]
The chip of thermoelectric conversion material of the present invention is characterized by having a concave on at least one surface of the chip of thermoelectric conversion material.

In view of the fact that a concave is provided on the surface of the chip of thermoelectric conversion material, for example, it becomes possible to fill a joining material layer which is used on the occasion of joining an electrode constituting a thermoelectric conversion module as mentioned later to the concave, and the joining properties to the electrode are improved, thereby leading to an improvement of the thermoelectric performance.

The shape of the chip of thermoelectric conversion material which is used in the present invention is preferably at least one selected from a rectangular parallelepiped shape, a cubic shape, and a columnar shape from the viewpoint of simplicity for obtaining high shape controllability.

Of these, a rectangular parallelepiped shape or a cubic shape is more preferred from the viewpoint of easiness of production and enhancement in a degree of integration of the chip of thermoelectric conversion material.

(Longitudinal Section of Chip of Thermoelectric Conversion Material)

As for the chip of thermoelectric conversion material of the present invention, in a longitudinal section including a central part in the width direction of the chip of thermoelectric conversion material, when the area of the longitudinal section is defined as S (μm²), a maximum value of the thickness in the thickness direction of the longitudinal section is defined as Dmax (μm), a maximum value of the length in the width direction of the longitudinal section is defined as Xmax (μm), and a maximum value of the depth of the concave of the longitudinal section is defined as Tmax (μm), the cross section of the concave of the longitudinal section of the chip of thermoelectric conversion material is satisfied with the following requirement (A) and requirement (B):

$$0<(Dmax \times Xmax - S)/(Dmax \times Xmax) \leq 0.20 \quad (A)$$

$$0.01 < Tmax/Dmax < 0.30 \text{ and } Tmax \geq 2 \text{ μm} \quad (B)$$

wherein, in the longitudinal section of the chip of thermoelectric conversion material, the maximum value Dmax of the thickness in the thickness direction of the longitudinal section means a maximum distance (thickness) between two points of intersection obtained on the occasion when in standing a perpendicular line on the bottom of the longitudinal section, the top and bottom ends of the thickness in the thickness direction of the longitudinal section intersect with the perpendicular line; the maximum value Xmax of the length in the width direction of the longitudinal section means a maximum distance (length) between two points of intersection obtained on the occasion when in drawing a parallel line parallel to the bottom of the longitudinal section, the left and right ends of the length in the width direction of the longitudinal section intersect with the parallel line; and the maximum value Tmax of the depth of the concave of the longitudinal section means a maximum distance (depth) obtained by subtracting a shortest distance (length) between a deepest part of the concave and a point of intersection obtained on the occasion of dropping a perpendicular line on the bottom of the longitudinal section from the deepest part of the concave, from the maximum value Dmax of the thickness in the thickness direction of the longitudinal section.

In this specification, the definition of the "longitudinal section including a central part of the chip of thermoelectric conversion material" is explained by reference to FIG. 1. FIG. 1 is a view for explaining a longitudinal section of the chip of thermoelectric conversion material of the present invention, in which (a) is a plan view of a chip 4 of thermoelectric conversion material, and the chip 4 of thermoelectric conversion material has a length X in the width direction and a length Y in the depth direction; and (b) is a longitudinal section of the chip 4 of thermoelectric conversion material, and the longitudinal section includes a central part C of the aforementioned (a) and means a hatched part (a rectangle in the drawing) having a length X and a thickness D obtained when cut between A-A' in the width direction.

The longitudinal section of the chip of thermoelectric conversion material which is used in the present invention is explained by reference to the accompanying drawings.

Figure 2:
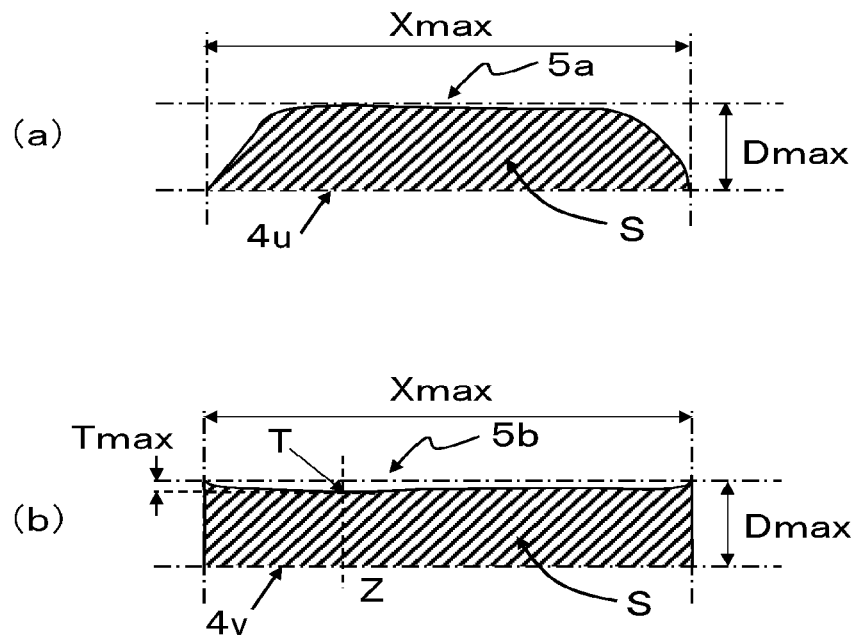
FIG. 2 is a cross-sectional view for explaining a longitudinal section of the chip of thermoelectric conversion material used for a thermoelectric conversion module of Examples or Comparative Examples of the present invention.

FIG. 2 is a cross-sectional view for explaining a longitudinal section of the chip of thermoelectric conversion material of the present invention used for a thermoelectric conversion module of Examples or Comparative Examples of the present invention, in which (a) is a longitudinal section of a chip $4u$ of thermoelectric conversion material used in Comparative Example 1, and the longitudinal section is an approximately quadrilateral shape (approximately trapezoidal shape). The longitudinal section is a longitudinal section (cross-sectional area S) having a maximum value Xmax of the length in the width direction and a maximum value Dmax of the thickness in the thickness direction, and an upper surface $5a$ of the longitudinal section is formed of a concave and a convex having a gentle curve, and both ends of the longitudinal section each have a slightly steep slope. (b) is a longitudinal section of a chip $4v$ of thermoelectric conversion material used in Example 1, and the longitudinal section is an approximately quadrilateral shape (rectangular shape). The longitudinal section is a longitudinal section (cross-sectional area S) having a maximum value Xmax of the length in the width direction and a maximum value Dmax of the thickness in the thickness direction, and an upper surface $5b$ of the longitudinal section is formed of a concave having a gentle curve, and both ends of the longitudinal section each have a slope as compared with the inside of the concave and give a maximum value Tmax of the depth of the concave in a deepest part T.

It is preferred that the cross section of the concave of the longitudinal section of the chip of thermoelectric conversion material is satisfied with the following requirement (A) and requirement (B):

$$0<(D\text{max}\times X\text{max}-S)/(D\text{max}\times X\text{max})\leq 0.20 \quad (A)$$

$$0.01<T\text{max}/D\text{max}<0.30 \text{ and } T\text{max}\geq 2 \text{ μm} \quad (B)$$

In the requirement (A), the "(Dmax×Xmax−S)/(Dmax× Xmax)" is a ratio of the area of the cross section of the concave of the longitudinal section of the chip of thermoelectric conversion material to the area of the longitudinal section of the chip of thermoelectric conversion material including the area of the cross section of the concave of the longitudinal section of the chip of thermoelectric conversion material, which is calculated in terms of Dmax×Xmax (the foregoing ratio will be occasionally referred to as "concave cross-sectional occupation ratio").

In the requirement (A), the concave cross-sectional occupation ratio is preferably 0<(Dmax×Xmax−S)/(Dmax× Xmax)≤0.20, more preferably 0.03<(Dmax×Xmax−S)/ (Dmax×Xmax)≤0.15, still more preferably 0.04<(Dmax× Xmax−S)/(Dmax×Xmax)≤0.13, and most preferably 0.05< (Dmax×Xmax−S)/(Dmax×Xmax)≤0.10.

When the concave cross-sectional occupation ratio falls within the aforementioned range, it is able to easily fill a joining material layer formed of a joining material as mentioned later which is used for joining a counter electrode to the concave of the upper surface of the chip of thermoelectric conversion material, and the joining material layer is inhibited from occurrence of going around and attaching to the side surface sides of the both ends of the longitudinal section of the chip of thermoelectric conversion material. In addition, the efficiency of the thermoelectric performance of the chip of thermoelectric conversion material is maintained.

In the requirement (B), the Tmax/Dmax is preferably 0.01<Tmax/Dmax<0.30, more preferably 0.07<Tmax/ Dmax<0.25, and still more preferably 0.10<Tmax/ Dmax<0.20.

When the Tmax/Dmax falls within the aforementioned range, not only the efficiency of the thermoelectric performance of the chip of thermoelectric conversion material is readily maintained, but also it becomes easy to form a chip of thermoelectric conversion material with excellent shape controllability and having a concave on the upper surface thereof.

In addition, the Tmax is preferably 2 μm or more, more preferably 2 to 50 μm, still more preferably 4 to 35 μm, and most preferably 4 to 20 μm.

When the Tmax falls within the aforementioned range, it becomes easy to secure a joining material layer having a thickness sufficient for joining of a counter electrode in a concave on the upper surface of the chip of thermoelectric conversion material and to improve mechanical joining strength and electrical joining property.

When the Tmax/Dmax and the Tmax fall within the aforementioned ranges, respectively, joining to the counter electrode is easily achieved, and the efficiency of the thermoelectric performance of the chip of thermoelectric conversion material is easily maintained.

The longitudinal section of the chip of thermoelectric conversion material falls within the aforementioned ranges of the requirements (A) and (B), not only the joining material layer formed of a joining material which is used for joining of a counter electrode is readily filled in the concave of the upper surface of the chip of thermoelectric conversion material, but also the joining material layer is inhibited from occurrence of going around to the side surface sides of the both ends of the longitudinal section of the chip of thermoelectric conversion material. As a result, the joining properties to the electrode are improved, and the efficiency of the thermoelectric performance of the chip of thermoelectric conversion material is maintained. Thus, the thermoelectric performance is expected to be improved.

On the occasion of constituting a thermoelectric conversion module as mentioned later, in order to achieve satisfactory joining to an opposing electrode, it is preferred that the concave of the chip of thermoelectric conversion material of the present invention has a joining material layer.

As the joining material which is used for the joining material layer, a solder material, a conductive adhesive, or a sintered joining agent is preferred, and the respective joining materials are provided in this order as a solder layer, a conductive adhesive layer, or a sintered joining agent layer in the concave of the chip of thermoelectric conversion material. From the viewpoint of reliability of connection, it is more preferred to use a solder material as the joining material.

The joining material layer may be one layer alone, or a laminate of two or more kind of layers may be used so long as it is disposed in the concave of the chip of thermoelectric conversion material. In addition, a layer other than the joining material layer may be used jointly in the concave within a range where the effects of the present invention are not impaired.

The term "conductive" as referred to in this specification indicates that the electrical resistivity is less than $1 \times 10^6$ $\Omega \cdot m$.

The solder material constituting the solder layer may be appropriately selected taking into consideration of a heat resistance temperature of the material constituting a thermoelectric conversion module and electrical conductivity and thermal conductivity as the solder layer. Examples thereof include already-known materials, such as Sn, an Sn/Pb alloy, an Sn/Ag alloy, an Sn/Cu alloy, an Sn/Sb alloy, an Sn/In alloy, an Sn/Zn alloy, an Sn/In/Bi alloy, an Sn/In/Bi/Zn alloy, an Sn/Bi/Pb/Cd alloy, an Sn/Bi/Pb alloy, an Sn/Bi/Cd alloy, a Bi/Pb alloy, an Sn/Bi/Zn alloy, an Sn/Bi alloy, an Sn/Bi/Pb alloy, an Sn/Pb/Cd alloy, and an Sn/Cd alloy. Alloys, such as a 43Sn/57Bi alloy, a 42Sn/58Bi alloy, a 40Sn/56Bi/4Zn alloy, a 48Sn/52In alloy, and a 39.8Sn/52In/7Bi/1.2Zn alloy, are preferred from the viewpoint of lead-free properties and/or cadmium-free properties, melting point, electrical conductivity, and thermal conductivity.

Examples of a commercially available product of the solder material include those mentioned below. For example, a 42Sn/58Bi alloy (a product name: SAM10-401-27, manufactured by TAMURA Corporation) and a 41Sn/58Bi/Ag alloy (a product name: PF141-LT7HO, manufactured by Nihon Handa Co., Ltd.) can be used.

The thickness of the solder layer (after heating and cooling) is preferably 10 to 200 µm, more preferably 20 to 150 µm, still more preferably 30 to 130 µm, and especially preferably 40 to 120 µm. When the thickness of the solder layer falls within this range, adhesion between the chip of thermoelectric conversion material and the electrode is readily obtained.

Examples of a method of applying the solder material include known methods, such as stencil printing, screen printing, and a dispensing method. Although the heating temperature varies with the solder material, the resin film, etc. to be used, the soldering is typically performed at 150 to 280° C. for 3 to 20 minutes.

Although the conductive adhesive constituting the conductive adhesive layer is not particularly restricted, examples thereof include conductive pastes. Examples of the conductive paste include a copper paste, a silver paste, and a nickel paste. In the case of using the binder, examples thereof include an epoxy resin, an acrylic resin, and a urethane resin.

Examples of a method of applying the conductive adhesive include known methods, such as screen printing and a dispensing method.

The thickness of the conductive adhesive layer is preferably 10 to 200 µm, more preferably 20 to 150 µm, still more preferably 30 to 130 µm, and especially preferably 40 to 120 µm.

Although the sintered joining agent constituting the sintered joining agent layer is not particularly restricted, examples thereof include sintering pastes. The sintering paste is, for example, formed of a micron-sized metal powder and nano-sized metal particles, and unlike the aforementioned conductive adhesive, it is used to directly join metals through sintering. The sintered joining agent may contain a binder, such as an epoxy resin, an acrylic resin, and a urethane resin.

Examples of the sintering paste include a silver sintering paste and a copper sintering paste.

Examples of a method of applying the sintered joining agent layer include known methods, such as screen printing, stencil printing, and a dispensing method. Although the sintering condition varies with the metal material, etc. to be used, the sintering is typically performed at 100 to 300° C. for 30 to 120 minutes.

As for a commercially available product of the sintered joining agent, for example, a sintering paste (a product name: CT2700R7S, manufactured by KYOCERA Corporation) and a sintering type metal joining material (a product name: MAX102, manufactured by Nihon Handa Co., Ltd.) can be used as a silver sintering paste.

The thickness of the sintered joining agent layer is preferably 10 to 200 µm, more preferably 20 to 150 µm, still more preferably 30 to 130 µm, and especially preferably 40 to 120 µm.

[Thermoelectric Conversion Module]

The thermoelectric conversion module of the present invention includes the chip of thermoelectric conversion material having a concave of the present invention. When the chip of thermoelectric conversion material is included, a thermoelectric conversion module in which the joining properties of the chip of thermoelectric conversion material with high shape controllability to the counter electrode are improved can be realized.

Figure 3:
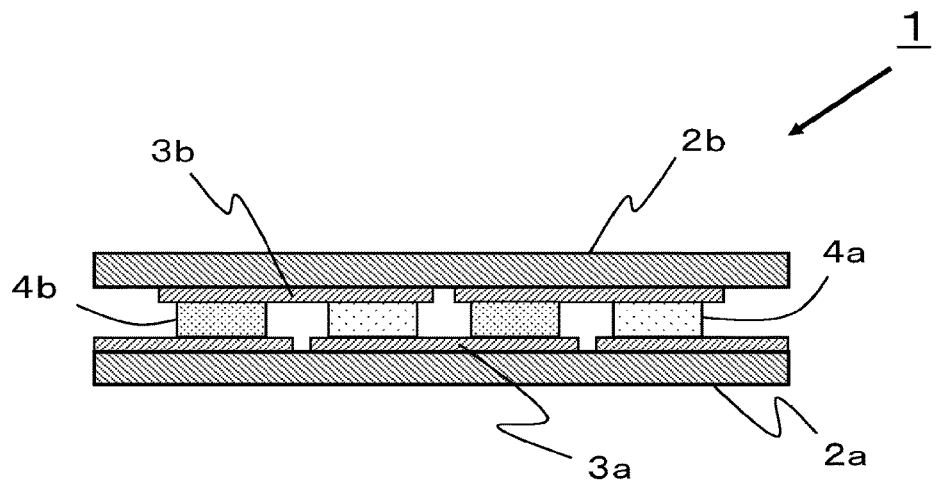
FIG. 3 is a cross-sectional constitutional view showing one example of a thermoelectric conversion module including a longitudinal section of the chip of thermoelectric conversion material of the present invention.

FIG. 3 is a cross-sectional constitutional view showing one example of a thermoelectric conversion module including the chip of thermoelectric conversion material having a concave of the present invention. A thermoelectric conversion module 1 includes a chip 4a of N-type thermoelectric conversion material and a chip 4b of P-type thermoelectric conversion material on an electrode 3a of a substrate 2a and further includes a counter electrode substrate having an electrode 3b on a substrate 2b on the upper surface of the chip 4a of N-type thermoelectric conversion material and the chip 4b of P-type thermoelectric conversion material. The chip 4a of N-type thermoelectric conversion material and the chip 4b of P-type thermoelectric conversion material, which are adjacent to each other, are disposed such that the both are electrically connected to each other in series via the electrode 3b on the substrate 2b, whereby the thermoelectric conversion module is constituted as a π type thermoelectric conversion device. The aforementioned joining material layer is included in the concave of each of the upper surfaces of the chip 4a of N-type thermoelectric conversion material and the chip 4b of P-type thermoelectric conversion material (not illustrated).

(Thermoelectric Conversion Material Layer)

The chip of thermoelectric conversion material which is used for the thermoelectric conversion module, namely the thermoelectric conversion material layer is preferably formed of a thermoelectric semiconductor composition containing a thermoelectric semiconductor material (thermoelectric semiconductor fine particles), a heat-resistant resin, and either one or both of an ionic liquid and an inorganic ionic compound.

(Thermoelectric Semiconductor Material)

The thermoelectric semiconductor material which is contained in the chip of thermoelectric conversion material is not particularly restricted so long as it is a material capable of generating a thermoelectromotive force by giving a temperature difference. Examples thereof include bismuth-tellurium-based thermoelectric semiconductor materials, such as P-type bismuth telluride and N-type bismuth telluride; telluride-based thermoelectric semiconductor materials, such as GeTe and PbTe; antimony-tellurium-based thermoelectric semiconductor materials; zinc-antimony-based thermoelectric semiconductor materials, such as ZnSb, $Zn_3Sb_2$, and $Zn_4Sb_3$; silicon-germanium-based thermoelectric semiconductor materials, such as SiGe; bismuth-selenide-based thermoelectric semiconductor materials, such as $Bi_2Se_3$; silicide-based thermoelectric semiconductor materials, such as β-$FeSi_2$, $CrSi_2$, $MnSi_{1.73}$, and $Mg_2Si$; oxide-based thermoelectric semiconductor materials; whistler materials, such as FeVAl, FeVAlSi, and FeVTiAl; and sulfide-based thermoelectric semiconductor materials, such as $TiS_2$.

Of these, bismuth-tellurium-based thermoelectric semiconductor materials, telluride-based thermoelectric semiconductor materials, antimony-tellurium-based thermoelectric semiconductor materials, or bismuth-selenide-based thermoelectric semiconductor materials are preferred.

Furthermore, a bismuth-tellurium-based thermoelectric semiconductor material, such as P-type bismuth telluride and N-type bismuth telluride, is more preferred from the viewpoint of the thermoelectric performance.

The P-type bismuth telluride is one in which the carrier is a hole, and the Seebeck coefficient is a positive value, and for example, one represented by $Bi_XTe_3Sb_{2-X}$ is preferably used. In this case, X is preferably $0<X≤0.8$, and more preferably $0.4≤X≤0.6$. When X is more than 0 and 0.8 or less, the Seebeck coefficient and the electrical conductivity become large, and the characteristics as a P-type thermoelectric element are maintained, and hence, such is preferred.

The N-type bismuth telluride is one in which the carrier is an electron, and the Seebeck coefficient is a negative value, and for example, one represented by $Bi_2Te_{3-Y}Se_Y$ is preferably used. In this case, Y is preferably $0≤Y≤3$ (when Y=0, $Bi_2Te_3$), and more preferably $0.1<Y≤2.7$. When Y is 0 or more and 3 or less, the Seebeck coefficient and the electrical conductivity become large, and the characteristics as an N-type thermoelectric element are maintained, and hence, such is preferred.

The thermoelectric semiconductor fine particles which are used for the thermoelectric semiconductor composition are those prepared by pulverizing the thermoelectric semiconductor material to a predetermined size by a pulverizer or the like.

The blending amount of the thermoelectric semiconductor fine particles in the thermoelectric semiconductor composition is preferably 30 to 99% by mass, more preferably 50 to 96% by mass, and still more preferably 70 to 95% by mass. When the blending amount of the thermoelectric semiconductor fine particles falls within the aforementioned range, the Seebeck coefficient (an absolute value of the Peltier coefficient) is large, a lowering of the electrical conductivity is suppressed, and only the thermal conductivity is lowered, and therefore, a film not only exhibiting a high thermoelectric performance but also having sufficient film strength and flexibility is obtained. Thus, such is preferred.

The average particle diameter of the thermoelectric semiconductor fine particles is preferably 10 nm or 200 μm, more preferably 10 nm to 30 μm, still more preferably 50 nm to 10 μm, and especially preferably 1 to 10 μm. When the average particle diameter of the thermoelectric semiconductor fine particles falls within the aforementioned range, the uniform dispersion becomes easy, and the electrical conductivity can be enhanced.

A method of pulverizing the thermoelectric semiconductor material to obtain thermoelectric semiconductor fine particles is not particularly limited, and the thermoelectric semiconductor material may be pulverized to a predetermined size by a known pulverizer, such as a jet mill, a ball mill, a beads mill, a colloid mill, and a roller mill.

The average particle diameter of the thermoelectric semiconductor fine particles is one obtained through measurement with a laser diffraction particle size analyzer (Mastersizer 3000, manufactured by Malvern Panalytical Ltd.), and a median value of the particle size distribution was taken.

The thermoelectric semiconductor fine particles are preferably those resulting from a heat treatment in advance (the "heat treatment" as referred to herein is different from the "annealing treatment" which is performed in the annealing treatment step as referred to in the present invention"). As for the thermoelectric semiconductor fine particles, by performing the heat treatment, the crystallinity is improved, and furthermore, the surface oxide films of the thermoelectric semiconductor fine particles are removed, and therefore, the Seebeck coefficient or the Peltier coefficient of the thermoelectric conversion material increases, whereby a thermoelectric figure of merit can be more improved. Although the heat treatment is not particularly limited, the heat treatment is preferably performed in an inert gas atmosphere of nitrogen, argon, or the like, in which the gas flow rate is controlled, or in a reducing gas atmosphere of hydrogen or the like, in which the gas flow rate is similarly controlled, or under a vacuum condition, such that the thermoelectric semiconductor fine particles are not adversely affected before preparation of the thermoelectric semiconductor composition. The heat treatment is more preferably performed in a mixed gas atmosphere of an inert gas and a reducing gas. Though a specific temperature condition depends upon the thermoelectric semiconductor fine particles to be used, typically, it is preferred to perform the heat treatment at a temperature of not higher than the melting point of the fine particles and at 100 to 1,500° C. for several minutes to several tens hours.

(Heat-Resistant Resin)

In the thermoelectric semiconductor composition which is used in the present invention, a heat-resistant resin is preferably used from the viewpoint that after forming the thermoelectric conversion material layer, the thermoelectric semiconductor material is subjected to an annealing treatment at a high temperature. The heat-resistant resin is one acting as a binder between the thermoelectric semiconductor materials (thermoelectric semiconductor fine particles) and capable of enhancing the flexibility of the thermoelectric conversion module and also making it easy to form a thin film by application or the like. Although the heat-resistant resin is not particularly restricted, a heat-resistant resin in which various physical properties as a resin, such as mechanical strength and thermal conductivity, are maintained without being impaired on the occasion of subjecting the thermoelectric semiconductor fine particles to crystal growth through an annealing treatment of a thin film formed of the thermoelectric semiconductor composition, or the like, is preferred.

As the heat-resistant resin, a polyamide resin, a polyamide-imide resin, a polyimide resin, and an epoxy resin are preferred from the standpoint that not only the heat resistance is higher, but also the crystal growth of the thermoelectric semiconductor fine particles in the thin film is not adversely affected; and a polyamide resin, a polyamide-imide resin, and a polyimide resin are more preferred from the standpoint that the flexibility is excellent. In the case where a polyimide film is used as a substrate as mentioned later, a polyimide resin is more preferred as the heat-resistant resin from the standpoint of adhesion to the polyimide film or the like. In the present invention, the polyimide resin is a generic term for a polyimide and a precursor thereof.

Preferably, the heat-resistant resin has a decomposition temperature of 300° C. or higher. When the decomposition temperature falls within the aforementioned range, even in the case of subjecting the thin film formed of the thermoelectric semiconductor composition to an annealing treatment as mentioned later, the flexibility can be maintained without losing the function as the binder.

As for the heat-resistant resin, its mass reduction rate at 300° C. by the thermogravimetry (TG) is preferably 10% or less, more preferably 5% or less, and still more preferably 1% or less. When the mass reduction rate falls within the aforementioned range, even in the case of subjecting the thin film formed of the thermoelectric semiconductor composition to an annealing treatment as mentioned later, the flexibility of the thermoelectric conversion material layer can be maintained without losing the function as the binder.

The blending amount of the heat-resistant resin in the thermoelectric semiconductor composition is 0.1 to 40% by mass, preferably 0.5 to 20% by mass, more preferably 1 to 20% by mass, and still more preferably 2 to 15% by mass. When the blending amount of the heat-resistant resin falls within the aforementioned range, the heat-resistant resin functions as a binder of the thermoelectric semiconductor material, a thin film is readily formed, and a film in which both high thermoelectric performance and film strength are made compatible with each other is obtained.

(Ionic Liquid)

The ionic liquid which is used in the present invention is a molten salt composed of a combination of a cation and an anion and refers to a salt capable of existing as a liquid in any temperature region of −50 to 500° C. The ionic liquid has such characteristic features that it has an extremely low vapor pressure and is nonvolatile; it has excellent heat stability and electrochemical stability; its viscosity is low; and its ionic conductivity is high, and therefore, the ionic liquid is able to effectively suppress a reduction of the electrical conductivity between the thermoelectric semiconductor fine particles as an electrical conductive assistant. In addition, the ionic liquid exhibits high polarity based on the aprotic ionic structure thereof and is excellent in compatibility with a heat-resistant resin, and therefore, the ionic liquid can make the thermoelectric element layer have a uniform electrical conductivity.

As the ionic liquid, any known materials or commercially available products can be used. Examples thereof include those constituted of a cation component, such as a nitrogen-containing cyclic cation compound, e.g., pyridinium, pyrimidinium, pyrazolium, pyrrolidinium, piperidinium, and imidazolium, and a derivative thereof, a tetraalkylammonium type amine-based cation and a derivative thereof, a phosphine-based cation, e.g., phosphonium, a trialkylsulfonium, and a tetraalkylphosphonium, and a derivative thereof, and a lithium cation and a derivative thereof; and an anion component, such as a halide anion, for example, a chloride ion, e.g., $Cl^-$, $AlCl_4^-$, $Al_2Cl_7^-$, and $ClO_4^-$, a bromide ion, e.g., $Br^-$, an iodide ion, e.g., $I^-$, a fluoride ion, e.g., $BF_4^-$ and $PF_6^-$, and $F(HF)_n^-$, $NO_3^-$, $CH_3COO^-$, $CF_3COO^-$, $CH_3SO_3$, $CF_3SO_3^-$, $(FSO_2)_2N^-$, $(CF_3SO_2)_2N^-$, $(CF_3SO_2)_3C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2N^-$, $C_3F_7COO^-$, and $(CF_3SO_2)(CF_3CO)N^-$.

Among the aforementioned ionic liquids, it is preferred that the cation component of the ionic liquid contains at least one selected from a pyridinium cation and a derivative thereof, and an imidazolium cation and a derivative thereof, from the viewpoint of the high-temperature stability, the compatibility between the thermoelectric semiconductor fine particles and the resin, suppressing a lowering in the electrical conductivity between the thermoelectric semiconductor fine particles, and so on. It is preferred that the anionic component of the ionic liquid contains a halide anion, and it is more preferred that at least one selected from $Cl^-$, $Br^-$, and $I^-$ is contained.

Specific examples of the ionic liquid in which the cation component contains any of a pyridinium cation and a derivative thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butyl-4-methylpyridinium bromide, 1-butyl-4-methylpyridinium hexafluorophosphate, and 1-butyl-4-methylpyridinium iodide. Of these, 1-butyl-4-methylpyridinium bromide, 1-butyl-4-methylpyridinium hexafluorophosphate, and 1-butyl-4-methylpyridinium iodide are preferred.

Specific examples of the ionic liquid in which the cation component contains any of an imidazolium cation and a derivative thereof include [1-butyl-3-(2-hydroxyethyl)imidazolium bromide], [1-butyl-3-(2-hydroxyethyl)imidazolium tetrafluoroborate], 1-ethyl-3-methyl)imidazolium chloride, 1-ethyl-3-methyl)imidazolium bromide, 1-butyl-3-methyl)imidazolium chloride, 1-hexyl-3-methyl) imidazolium chloride, 1-octyl-3-methyl)imidazolium chloride, 1-decyl-3-methyl)imidazolium chloride, 1-decyl-3-methyl)imidazolium bromide, 1-dodecyl-3-methyl)imidazolium chloride, 1-tetradecyl-3-methyl)imidazolium chloride, 1-ethyl-3-methyl)imidazolium tetrafluoroborate, 1-butyl-3-methyl)imidazolium tetrafluoroborate, 1-hexyl-3-methyl)imidazolium tetrafluoroborate, 1-ethyl-3-methyl) imidazolium hexafluorophosphate, 1-butyl-3-methyl)imidazolium hexafluorophosphate, 1-methyl-3-butylimidazolium methyl sulfate, and 1,3-dibutylimidazolium methyl sulfate. Of these, [1-butyl-3-(2-hydroxyethyl)imidazolium bromide] and [1-butyl-3-(2-hydroxyethyl)imidazolium tetrafluoroborate] are preferred.

The aforementioned ionic liquid has an electrical conductivity of preferably $10^{-7}$ S/cm or more, and more preferably $10^{-6}$ S/cm or more. When the electrical conductivity falls within the aforementioned range, a reduction of the electrical conductivity between the thermoelectric semiconductor fine particles can be effectively suppressed as the electrical conductive assistant.

Preferably, the ionic liquid has a decomposition temperature of 300° C. or higher. When the decomposition temperature falls within the aforementioned range, even in the case of subjecting the thin film of the thermoelectric conversion material layer formed of the thermoelectric semiconductor composition to an annealing treatment as mentioned later, the effect as the electrical conductive assistant can be maintained.

As for the ionic liquid, its mass reduction rate at 300° C. by the thermogravimetry (TG) is preferably 10% or less, more preferably 5% or less, and still more preferably 1% or less. When the mass reduction rate falls within the aforementioned range, even in the case of subjecting the thin film of the thermoelectric conversion material layer formed of the thermoelectric semiconductor composition to an annealing treatment as mentioned later, the effect as the electrical conductive assistant can be maintained.

The blending amount of the ionic liquid in the thermoelectric semiconductor composition is preferably 0.01 to 50% by mass, more preferably 0.5 to 30% by mass, and still more preferably 1.0 to 20% by mass. When the blending amount of the ionic liquid falls within the aforementioned range, a lowering of the electrical conductivity is effectively suppressed, and a film having a high thermoelectric performance is obtained.

(Inorganic Ionic Compound)

The inorganic ionic compound which is used in the present invention is a compound constituted of at least a cation and an anion. The inorganic ionic compound is a solid at room temperature, has a melting point at any temperature in a temperature region of 400 to 900° C., and has such a characteristic feature that its ionic conductivity is high, and therefore, it is able to suppress a reduction of the electrical conductivity between the thermoelectric semiconductor fine particles as the electrical conductive assistant.

A metal cation is used as the cation.

Examples of the metal cation include an alkali metal cation, an alkaline earth metal cation, a typical metal cation, and a transition metal cation, with an alkali metal cation or an alkaline earth metal cation being preferred.

Examples of the alkali metal cation include $Li^+$, $Na^+$, $K^+$, $Rb^+$, $Cs^+$, and $Fr^+$.

Examples of the alkaline earth metal cation include $Mg^{2+}$, $Ca^{2+}$, $Sr^{2+}$, and $Ba^{2+}$.

Examples of the anion include $Br^-$, $Cl^-$, $Br^-$, $I^-$, $OH^-$, $CN^-$, $NO_3^-$, $NO_2^-$, $ClO^-$, $ClO_2^-$, $ClO_3^-$, $ClO_4^-$, $CrO_4^{2-}$, $HSO_4^-$, $SCN^-$, $BF_4^-$, and $PF_6^-$.

As the inorganic ionic compound, any known materials or commercially available products can be used. Examples thereof include those constituted of a cation component, such as a potassium cation, a sodium cation, and a lithium cation; and an anion component, such as a halide anion, for example, a chloride ion, e.g., $Cl^-$, $AlCl_4^-$, $Al_2Cl_7^-$, and $ClO_4^-$, a bromide ion, e.g., $Br^-$, an iodide ion, such as $I^-$, a fluoride ion, e.g., $BF_4^-$ and $PF_6^-$, and $F(HF)_n^-$, $NO_3^-$, $OH^-$, and $CN^-$.

Among the aforementioned inorganic ionic compounds, it is preferred that the cation component of the inorganic ionic compound contains at least one selected from potassium, sodium, and lithium from the viewpoint of the high-temperature stability, the compatibility between the thermoelectric semiconductor fine particles and the resin, suppressing a lowering of the electrical conductivity between the thermoelectric semiconductor fine particles, and so on. In addition, the anion component of the inorganic ionic compound contains preferably a halide anion, and more preferably at least one selected from $Cl^-$, $Br^-$, and $I^-$.

Specific examples of the inorganic ionic compound in which the cation component contains a potassium cation include KBr, KI, KCl, KF, KOH, and $K_2CO_3$. Of these, KBr and KI are preferred.

Specific examples of the inorganic ionic compound in which the cation component contains a sodium cation include NaBr, NaI, NaOH, NaF, and $Na_2CO_3$. Of these, NaBr and NaI are preferred.

Specific examples of the inorganic ionic compound in which the cation component contains a lithium cation include LiF, LiOH, and $LiNO_3$. Of these, LiF and LiOH are preferred.

The aforementioned inorganic ionic compound has an electrical conductivity of preferably $10^{-7}$ S/cm or more, and more preferably $10^{-6}$ S/cm or more. When the electrical conductivity falls within the aforementioned range, a reduction of the electrical conductivity between the thermoelectric semiconductor fine particles can be effectively suppressed as the electrical conductive assistant.

Preferably, the inorganic ionic compound has a decomposition temperature of 400° C. or higher. When the decomposition temperature falls within the aforementioned range, even in the case of subjecting the thin film of the thermoelectric conversion material layer formed of the thermoelectric semiconductor composition to an annealing treatment as mentioned later, the effect as the electrical conductive assistant can be maintained.

As for the inorganic ionic compound, its mass reduction rate at 400° C. by the thermogravimetry (TG) is preferably 10% or less, more preferably 5% or less, and still more preferably 1% or less. When the mass reduction rate falls within the aforementioned range, even in the case of subjecting the thin film of the thermoelectric conversion material layer formed of the thermoelectric semiconductor composition to an annealing treatment as mentioned later, the effect as the electrical conductive assistant can be maintained.

The blending amount of the inorganic ionic compound in the thermoelectric semiconductor composition is preferably 0.01 to 50% by mass, more preferably 0.5 to 30% by mass, and still more preferably 1.0 to 10% by mass. When the blending amount of the inorganic ionic compound falls within the aforementioned range, a lowering of the electrical conductivity can be effectively suppressed, and as a result, a film having an improved thermoelectric performance is obtained.

In the case of using a combination of the inorganic ionic compound and the ionic liquid, the total amount of contents of the inorganic ionic compound and the ionic liquid in the thermoelectric semiconductor composition is preferably 0.01 to 50% by mass, more preferably 0.5 to 30% by mass, and still more preferably 1.0 to 10% by mass.

(Other Additives)

The thermoelectric semiconductor composition which is used in the present invention may further contain, in addition to the aforementioned components, other additives, such as a dispersant, a film-forming assistant, a photostabilizer, an antioxidant, a tackifier, a plasticizer, a coloring agent, a resin stabilizer, a filler, a pigment, a conductive filler, a conductive polymer, and a curing agent, as the need arises. These additives can be used alone or in combination of two or more thereof.

(Preparation Method of Thermoelectric Semiconductor Composition)

The preparation method of a thermoelectric semiconductor composition which is used in the present invention is not particularly restricted, and the thermoelectric semiconductor composition may be prepared by adding the aforementioned thermoelectric semiconductor fine particles, the aforementioned heat-resistant resin, and the aforementioned ionic liquid and/or inorganic ionic compound, and optionally the aforementioned other additives and further a solvent, and mixing and dispersing them by a known method using an ultrasonic homogenizer, a spiral mixer, a planetary mixer, a disperser, a hybrid mixer, or the like.

Examples of the solvent include solvents, such as toluene, ethyl acetate, methyl ethyl ketone, an alcohol, tetrahydrofuran, N-methylpyrrolidone, and ethyl cellosolve. These solvents may be used alone or may be used in admixture of two or more thereof. The solid content concentration of the thermoelectric semiconductor composition is not particularly restricted so long as the composition has a viscosity suited for application.

(Production Method of Chip of Thermoelectric Conversion Material)

In the present invention, the chip of thermoelectric conversion material is formed on a substrate or an electrode by using a coating liquid formed of the thermoelectric semiconductor composition, or the like.

Examples of a production method of the chip of thermoelectric conversion material constituting the thermoelectric conversion module of the present invention, which is satisfied with the aforementioned requirements (A) and (B), include a method described in the following (P).

(P) Pattern Frame Disposition/Release Method (Pattern Frame Disposition/Release Method)

The pattern frame disposition/release method is a method in which by providing a pattern frame having openings spaced apart from each other on a substrate, filling a thermoelectric semiconductor composition in the openings and drying it, and then releasing the pattern frame from the substrate, a thermoelectric conversion material layer with excellent shape controllability in which the shapes of the openings of the pattern frame are reflected is formed.

The production process includes a step of providing a pattern frame having openings on a substrate; a step of filling the thermoelectric semiconductor composition in the openings; a step of drying the thermoelectric semiconductor composition filled in the openings, to form a thermoelectric conversion material layer; and a step of releasing the pattern frame from the substrate.

One example of the production method of a thermoelectric conversion material layer adopting the pattern frame disposition/release method is specifically explained by reference to the accompanying drawing.

Figure 4:
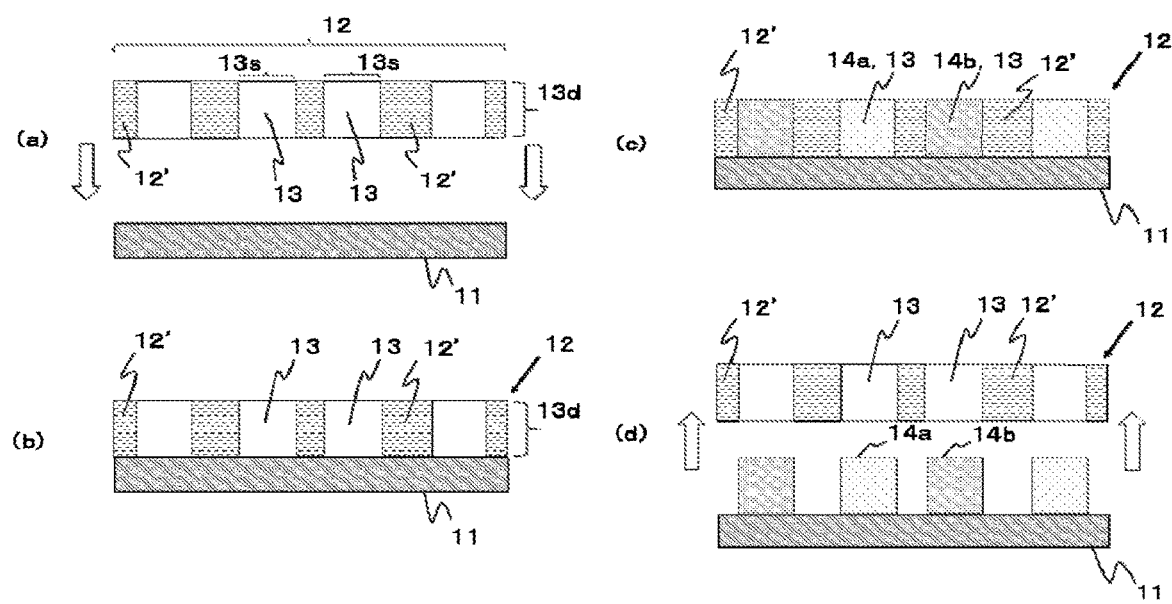
FIG. 4 is an explanatory view showing one example of a production method of the chip of thermoelectric conversion material by a pattern frame disposition/release method used for the present invention in order of steps.

FIG. 4 is an explanatory view showing one example of a production method of the thermoelectric conversion material layer by the pattern frame disposition/release method used for the present invention in order of steps.

(a) is a cross-sectional view showing an embodiment of the pattern frame having been opposed on the substrate, and in which a pattern frame 12 formed of a stainless steel 12' and having apertures 13s and openings 13 and having an opening depth (pattern frame thickness) 13d is prepared and opposed to a substrate 11;

(b) is a cross-sectional view after providing the pattern frame on the substrate, in which the pattern frame 12 is provided on the substrate 11;

(c) is a cross-sectional view after filling the thermoelectric conversion material layer in the openings of the pattern frame, in which a thermoelectric semiconductor composition containing a P-type thermoelectric semiconductor material and a thermoelectric semiconductor composition containing an N-type thermoelectric semiconductor material are each filled in the predetermined openings 13 having the apertures 13s of the pattern frame 12 formed of the stainless steel 12' prepared in (b), and the thermoelectric semiconductor composition containing the P-type thermoelectric semiconductor material and the thermoelectric semiconductor composition containing the N-type thermoelectric semiconductor material, each of which is filled in the openings 13, are dried, to form a P-type thermoelectric conversion material layer 14b and an N-type thermoelectric conversion material layer 14a; and (d) is a cross-sectional view showing an embodiment of releasing the pattern frame from the filled thermoelectric conversion material layer to obtain only the thermoelectric conversion material layer, in which the pattern frame 12 is released from the formed P-type thermoelectric conversion material layer 14b and N-type thermoelectric conversion material layer 14a, to obtain the P-type thermoelectric conversion material layer 14b and the N-type thermoelectric conversion material layer 14a as free-standing layers.

As the drying method, conventionally known drying methods, such as a hot-air drying method, a heat roll drying method, and an infrared ray irradiation, can be adopted. The heating temperature is typically 80 to 150° C., and though the heating time varies with the heating method, it is typically several seconds to several tens minutes.

In the case of using a solvent in the preparation of the thermoelectric semiconductor composition, the heating temperature is not particularly restricted so long as it is in a temperature range in which the used solvent can be dried.

According to the aforementioned method, the chip of thermoelectric conversion material of the present invention which is used for the thermoelectric conversion module can be obtained.

In this way, by adopting the pattern frame disposition/release method, the chip of thermoelectric conversion material which is satisfied with the aforementioned requirements (A) and (B) can be readily obtained.

The viscosity of the coating liquid formed of the thermoelectric semiconductor composition is appropriately adjusted according to the blending amount of the thermoelectric semiconductor material, the thickness of the thermoelectric conversion material layer, and the dimensions of the pattern; however, it is, for example, 1 Pa·s to 1,000 Pa·s, preferably 5 Pa·s to 500 Pa·s, more preferably 10 Pa·s to 300 Pa·s, and still more preferably 30 Pa·s to 200 Pa·s under a condition at 25° C. and 5 s$^{-1}$ from the viewpoint of the shape controllability of the thermoelectric conversion material layer and controlling the shape of the concave and the depth of the deepest part.

In the case of using a thin film of the thermoelectric conversion material layer formed of the thermoelectric semiconductor composition as the n-type thermoelectric conversion device, its thickness is 50 μm or more and 1 mm or less, preferably 80 μm or more and 1 mm or less, more preferably 100 μm or more and 700 μm or less, and still more preferably 150 μm or more and 500 μm or less from the viewpoint of use for a screen printing method, a stencil printing method, or the like.

(Annealing Treatment)

In the present invention, it is preferred to perform an annealing treatment after forming the thermoelectric conversion material layer. By performing the annealing treatment, not only the thermoelectric performance can be stabilized, but also the thermoelectric semiconductor fine particles in the thermoelectric conversion material layer can be subjected to crystal growth, and the thermoelectric performance can be more improved.

Although the annealing treatment is not particularly limited, typically, it is performed in an inert gas atmosphere of nitrogen, argon, or the like, in which the gas flow rate is controlled, or in a reducing gas atmosphere, or under a vacuum condition. Although the temperature of the annealing treatment depends upon the heat-resistant resin, the ionic liquid, or the inorganic ionic compound to be used, or the like, the annealing treatment is performed typically at 100 to 600° C. for several minutes to several tens hours, preferably at 150 to 600° C. for several minutes to several tens hours, more preferably at 250 to 600° C. for several minutes to several tens hours, and still more preferably at 250 to 550° C. for several minutes to several tens hours.

(Substrate)

In the thermoelectric conversion module of the present invention, thought the substrate is not particularly restricted, a resin film which neither lowers the electrical conductivity of the thermoelectric conversion material layer nor affects the increase of the thermal conductivity is used from the viewpoint of thinning and flexibility. Above all, a polyimide film, a polyamide film, a polyether imide film, a polyaramid film, and a polyamide-imide film are preferred from the standpoint that they are excellent in flexibility, and even in the case where a thin film of the thermoelectric conversion material layer formed of a thermoelectric semiconductor composition is subjected to an annealing treatment, the performance of the thermoelectric conversion material layer can be maintained without causing thermal deformation of the substrate, and the heat resistance and the dimensional stability are high; and furthermore, a polyimide film is especially preferred from the standpoint that it is high in versatility.

The thickness of the film substrate is preferably 1 to 1,000 μm, more preferably 5 to 500 μm, and still more preferably 10 to 50 μm from the viewpoint of flexibility, heat resistance, and dimensional stability.

A 5% weight-reduction temperature of the resin film as measured by the thermogravimetric analysis is preferably 300° C. or higher, and more preferably 400° C. or higher. A dimensional change rate on heating as measured at 200° C. in conformity with JIS K7133 (1999) is preferably 0.5% or less, and more preferably 0.3% or less. A coefficient of linear expansion in the planar direction as measured in conformity with JIS K7197 (2012) is 0.1 ppm·° C.$^{-1}$ to 50 ppm·° C.$^{-1}$, and more preferably 0.1 ppm·° C.$^{-1}$ to 30 ppm·° C.$^{-1}$.

As the substrate which is used in the present invention, an insulating material, such as a glass and a ceramic, may also be used. The thickness of the substrate is preferably 5 to 1,200 μm, more preferably 10 to 800 μm, and still more preferably 30 to 700 μm from the viewpoint of process and dimensional stability.

(Electrode)

Examples of a metal material of the electrode of the thermoelectric conversion module which is used in the present invention include copper, gold, nickel, aluminum, rhodium, platinum, chromium, palladium, stainless steel, molybdenum, and tin, and alloys containing any of these metals.

The thickness of the layer of the electrode is preferably 10 nm to 200 μm, more preferably 30 nm to 150 μm, and still more preferably 50 nm to 120 μm. When the thickness of the layer of the electrode falls within the aforementioned range, the electrical conductivity is high, the resistance is low, and a sufficient strength as the electrode is obtained.

The formation of the electrode is performed using the aforementioned metal material.

Examples of a method of forming an electrode include a method in which after an electrode having no pattern formed thereon is provided on the resin film, the resultant is processed into a predetermined pattern shape by a known physical treatment or chemical treatment mainly adopting in the photolithography method, or a combination thereof; and a method in which a pattern of an electrode is directly formed by a screen printing method, an inkjet method, or the like.

Examples of the forming method of an electrode having no pattern formed thereon include dry processes, such as PVD (physical vapor deposition method), e.g., a vacuum evaporation method, a sputtering method, and an ion plating method, and CVD (chemical vapor deposition method), e.g., hot CVD and atomic layer deposition (ALD); wet processes, such as various coating methods, e.g., a dip coating method, a spin coating method, a spray coating method, a gravure coating method, a die coating method, and a doctor blade method, or electrodeposition method or the like; a silver salt method, an electroplating method, an electroless plating method, and lamination of a metal foil, and the forming method is properly selected according to the material of the electrode.

The electrode which is used in the present invention is required to have high electrical conductivity and high thermal conductivity from the viewpoint of maintaining the thermoelectric performance, and therefore, an electrode resulting from film formation by a plating method or a vacuum film formation method is preferably used. In view of the fact that high electrical conductivity and high thermal conductivity can be readily realized, a vacuum film formation method, such as a vacuum evaporation method and a sputtering method, an electroplating method, and an electroless plating method are preferred. The pattern can also be readily formed while interposing a hard mask, such as a metal mask, though it depends upon the size and dimensional accuracy of the formed pattern.

(Joining Material Layer)

In the thermoelectric conversion module which is used in the present invention, a joining material layer can be used for joining between the thermoelectric conversion material layer and the electrode. The joining material layer is included in the concave of the chip of thermoelectric conversion material in the constitution of the thermoelectric conversion module of the present invention. The foregoing joining material layer is one as mentioned above.

In view of the fact that the longitudinal section including the cross section of the concave of the thermoelectric conversion material layer is satisfied with the requirements (A) and (B), a thermoelectric conversion module having an excellent thermoelectric performance with high joining properties of the thermoelectric conversion material layer to an electrode can be obtained. In addition, it is possible to lead to realization of high integration of the thermoelectric conversion material layer.

EXAMPLES

The present invention is hereunder described in more detail by reference to Examples, but it should be construed that the present invention is not limited by these Examples.

The evaluation of the electrical resistivity value and the evaluation of the concave cross-sectional occupation ratio of the thermoelectric conversion module prepared in each of the Examples and Comparative Examples were performed by the following methods.

(a) Evaluation of Electrical Resistivity Value

The electrical resistivity value between extraction electrodes of the thermoelectric conversion module including the obtained thermoelectric conversion material layer (chip) was measured in the environment of 25° C.×50% RH by using Digital HiTester (Model Name: 3801-50, manufactured by Hioki E.E. Corporation).

(b) Concave Cross-Sectional Occupation Ratio

The longitudinal section including a central part of the thermoelectric conversion material layer (chip) of the obtained thermoelectric conversion module (see FIG. 2(b)) was observed by a digital microscope (Model Name: VHX-5000, manufactured by Keyence Corporation), and the area S (μm$^2$) of the longitudinal section, the maximum value Dmax (μm) of the thickness in the thickness direction of the longitudinal section, the maximum value Xmax (μm) of the length in the width direction of the longitudinal section, the maximum value Tmax (μm) of the depth of the concave of the longitudinal section), and the shortest distance (μm) between a deepest part T and a point of intersection (Z) obtained on the occasion of dropping a perpendicular line on the bottom of the longitudinal section from the deepest part T were measured. Using the Dmax, Xmax, and S as obtained through the measurement, the concave cross-sectional occupation ratio (Dmax×Xmax−S)/(Dmax×Xmax) was calculated and evaluated.

Example 1

The thermoelectric semiconductor material constituting the thermoelectric semiconductor composition is used as thermoelectric semiconductor fine particles.
(Preparation of Thermoelectric Semiconductor Fine Particles)

A P-type bismuth telluride $Bi_{0.4}Te_3Sb_{1.6}$ (manufactured by Kojundo Chemical Laboratory Co., Ltd., particle diameter: 180 μm) that is a bismuth-tellurium-based thermoelectric semiconductor material was pulverized in a nitrogen gas atmosphere by using a planetary type ball mill (Premium line P-7, manufactured by Fritsch Japan Co., Ltd.), to prepare thermoelectric semiconductor fine particles T1 having an average particle diameter of 1.2 μm. The thermoelectric semiconductor fine particles obtained through pulverization were measured for particle size distribution by using a laser diffraction particle size analyzer (Mastersizer 3000, manufactured by Malvern P analytical Ltd.).

In addition, an N-type bismuth telluride $Bi_2Te_3$ (manufactured by Kojundo Chemical Laboratory Co., Ltd., particle diameter: 180 μm) that is a bismuth-tellurium-based thermoelectric semiconductor material was pulverized in the same manner as mentioned above, to prepare thermoelectric semiconductor fine particles T2 having an average particle diameter of 1.4 μm.
(Preparation of Coating Liquid)
Coating Liquid (P)

90 parts by mass of the obtained fine particles T1 of the P-type bismuth-tellurium-based thermoelectric semiconductor material, 5 parts by mass of a polyamic acid (manufactured by Sigma-Aldrich Co. LLC., poly(pyromellitic dianhydride-co-4,4'-oxydianiline) amic acid solution, solvent: N-methylpyrrolidone, solid content concentration: 15% by mass) that is a polyimide precursor as a heat-resistant resin, and 5 parts by mass of [1-butyl-3-(2-hydroxyethyl)imidazolium bromide] as an ionic liquid were mixed and dispersed to prepare a coating liquid (P) formed of the thermoelectric semiconductor composition. The viscosity of the coating liquid (P) was 170 Pa·s.
Coating Liquid (N)

90 parts by mass of the obtained fine particles T2 of the N-type bismuth-tellurium-based thermoelectric semiconductor material, 5 parts by mass of a polyamic acid (manufactured by Sigma-Aldrich Co. LLC., poly(pyromellitic dianhydride-co-4,4'-oxydianiline) amic acid solution, solvent: N-methylpyrrolidone, solid content concentration: 15% by mass) that is a polyimide precursor as a heat-resistant resin, and 5 parts by mass of [1-butyl-3-(2-hydroxyethyl)imidazolium bromide] as an ionic liquid were mixed and dispersed to prepare a coating liquid (N) formed of the thermoelectric semiconductor composition. The viscosity of the coating liquid (N) was 170 Pa·s.
(Formation of Thermoelectric Conversion Material Layer)

The thermoelectric conversion material layer was formed by the following pattern frame disposition/release method, to prepare a n-type thermoelectric conversion module.

(Formation of Thermoelectric Element Layer by Pattern Frame Disposition/Release Method)

On electrodes of a lower polyimide film substrate (KAPTON 200H, manufactured by Du Pont-Toray Co., Ltd., 100 mm×100 mm, thickness: 50 μm), a pattern frame having a plate thickness of 200 μm as designed so as to have openings spaced apart from each other was provided, the coating liquids (P) and (N) were printed on the openings and dried, and the pattern frame was then released from the substrate, thereby providing 100 pairs in total of a P-type thermoelectric conversion material layer/N-type thermoelectric conversion material layer pair of 1.5 mm×1.5 mm.

The drying after applying the coating liquids was performed in an argon atmosphere at a temperature of 150° C. for 10 minutes; the annealing treatment relative to the thin film of the obtained thermoelectric conversion material layer was performed in an atmosphere of a mixed gas of hydrogen and argon (hydrogen/argon=3% by volume/97% by volume) by raising the temperature at a rate of 5 K/min and holding at 325° C. for 1 hour, to subject the fine particles of thermoelectric semiconductor material to crystal growth, thereby forming the P-type thermoelectric conversion material layer and the N-type thermoelectric conversion material layer. The thickness of the thermoelectric conversion material layer was 180 μm in the both ends of the concave of the upper surface and 5 μm in the deepest part of the concave, respectively, and the concave cross-sectional occupation ratio was 0.05.

Subsequently, a n-type thermoelectric conversion module (Peltier cooling device) in which 100 pairs of a P-type thermoelectric conversion material layer/N-type thermoelectric conversion material layer were alternately arranged in series and electrically connected to each in series was prepared by forming so as to be filled with a solder material (PF141-LT7HO F=10, manufactured by Nihon Handa Co., Ltd.) in the concave of the upper surface of the P-type thermoelectric conversion material layer and the N-type thermoelectric conversion material layer and joining to electrodes on an upper polyimide film substrate (having the same specifications as in the lower polyimide film substrate, except for the disposition of electrodes; and the electrodes were disposed such that the 100 pairs of a P-type thermoelectric conversion material layer/N-type thermoelectric conversion material layer were alternatively disposed in series and electrically connected to each other in series).

The distance between the centers of the P-type thermoelectric conversion material layer and the N-type thermoelectric conversion material layer formed on the electrodes of the lower polyimide film substrate was 2.5 mm, and the distance between the centers of the P-type thermoelectric conversion material layer and the N-type thermoelectric conversion material layer formed on the electrodes of the upper polyimide film substrate was 2.5 mm.

Example 2

A π-type thermoelectric conversion module of Example 2 was prepared in the same manner as in Example 1, except that the viscosity of each of the coating liquid (P) and the coating liquid (N) was adjusted to 120 Pa·s by adding N-methylpyrrolidone. The thickness of the thermoelectric conversion material layer after the annealing treatment was 170 μm in the both ends of the concave of the upper surface and 8 μm in the deepest part of the concave, respectively, and the concave cross-sectional occupation ratio was 0.07.

Example 3

A π-type thermoelectric conversion module of Example 3 was prepared in the same manner as in Example 1, except that the viscosity of each of the coating liquid (P) and the coating liquid (N) was adjusted to 70 Pa·s by adding N-methylpyrrolidone. The thickness of the thermoelectric conversion material layer after the annealing treatment was 160 μm in the both ends of the concave of the upper surface and 10 μm in the deepest part of the concave, respectively, and the concave cross-sectional occupation ratio was 0.10.

Comparative Example 1

A π-type thermoelectric conversion module of Comparative Example 1 was prepared in the same manner as in Example 1, except that the pattern frame disposition/release method was not performed for the formation of the P-type thermoelectric conversion material layer and the N-type thermoelectric conversion material layer, but the P-type thermoelectric conversion material layer and the N-type thermoelectric conversion material layer were formed with a pattern with a stencil plate having a plate thickness of 235 μm. The thickness of the thermoelectric conversion layer after the annealing treatment was 180 μm.

Comparative Example 2

A π-type thermoelectric conversion module of Comparative Example 2 was prepared in the same manner as in Example 1, except that the viscosity of each of the coating liquid (P) and the coating liquid (N) was adjusted to 30 Pa·s by adding N-methylpyrrolidone. The thickness of the thermoelectric conversion material layer after the annealing treatment was 130 μm in the both ends of the concave of the upper surface and 30 μm in the deepest part of the concave, respectively, and the concave cross-sectional occupation ratio was 0.30.

The electrical resistivity value, the concave cross-sectional occupation ratio, the deepest part Tmax, the Dmax, and the Dmax/Xmax of each of the thermoelectric conversion modules obtained in Examples 1 to 3 and Comparative Examples 1 to 2 were evaluated. The evaluation results are shown in Table 1.

Examples 1 to 3, the electrical resistivity value between the electrode parts on the ends of the thermoelectric conversion module is low, and a high thermoelectric performance is obtained, as compared with the thermoelectric conversion module including a thermoelectric conversion material layer having no concave according to Comparative Example 1. In addition, it is noted that in the thermoelectric conversion modules including a thermoelectric conversion material layer (chip) having a longitudinal section satisfying the requirements (A) and (B) according to Examples 1 to 3, the electrical resistivity value between the electrode parts on the ends of the thermoelectric conversion module is low, and a high thermoelectric performance is obtained, as compared with the thermoelectric conversion module including a thermoelectric conversion material layer (chip) having a longitudinal section not satisfying the requirement (A).

INDUSTRIAL APPLICABILITY

In accordance with the chip of thermoelectric conversion material of the present invention, in view of the fact that in the thermoelectric conversion module including a chip of thermoelectric conversion material having a longitudinal section satisfying the requirements (A) and (B), the shape of the chip of thermoelectric conversion material is, for example, one in which not only it has an rectangular parallelepiped shape, but also a specified concave is formed on an upper surface, the joining material to be used for joining the chip of thermoelectric conversion material to the electrode can be filled in the concave and does not go around to the side surface sides of the chip of thermoelectric conversion material. Therefore, the electrical resistivity value of the chip of thermoelectric material of the present invention can be controlled low, and the thermoelectric performance can be expected to be improved. Furthermore, in view of the fact that the thermoelectric conversion module using the chip of thermoelectric conversion material of the present invention is excellent in the shape controllability of the chip of thermoelectric conversion material, high integration can be expected to be realized.

TABLE 1

| | | | Thermoelectric conversion material layer (chip) | | | | | | |
|---|---|---|---|---|---|---|---|---|---|
| | Constitution | Forming method | Viscosity of coating liquid (P) (Pa · s) | Viscosity of coating liquid (N) (Pa · s) | Concave cross-sectional occupation ratio (Dmax × Xmax · S)/ (Dmax × Xmax) | Tmax (μm) | Dmax (μm) | Dmax/ Xmax | Electrical resistivity value (Ω) |
| Example 1 | n-Type | Pattern frame disposition/release method | 170 | 170 | 0.05 | 5 | 180 | 0.12 | 0.0015 |
| Example 2 | n-Type | Pattern frame disposition/release method | 120 | 120 | 0.07 | 8 | 170 | 0.11 | 0.0022 |
| Example 3 | n-Type | Pattern frame disposition/release method | 70 | 70 | 0.10 | 10 | 160 | 0.11 | 0.0020 |
| Comparative Example 1 | n-Type | Pattern printing | 170 | 170 | — | — | 180 | 0.12 | 0.0600 |
| Comparative Example 2 | n-Type | Pattern frame disposition/release method | 30 | 30 | 0.30 | 30 | 130 | 0.09 | 0.0930 |

As is clear from Table 1, it is noted that in the case of making the comparison in terms of the constitution of the π-type thermoelectric conversion device, in the thermoelectric conversion modules including a thermoelectric conversion material layer (chip) having a concave according to It may be thought to apply the aforementioned thermoelectric conversion module to use of power generation for electrically converting exhaust heat from a factory or various combustion furnaces, such as a waste combustion furnace and a cement combustion furnace, exhaust heat of combustion gas of an automobile, and exhaust heat of electronic equipment. As for the cooling use, in the field of electronic equipment, it may be thought to be applied to use for temperature control of various sensors, for example, a CPU (Central Processing Unit) used for a smartphone, various computers, and the like, image sensors, such as a CMOS (Complementary Metal Oxide Semiconductor Image Sensor) and a CCD (Charge Coupled Device), and MEMS (Micro Electro Mechanical Systems) and other light receiving elements.

REFERENCE SIGNS LIST

1: Thermoelectric conversion module
2a: Substrate
2b: Substrate
3a: Electrode
3b: Electrode
4, 4u, 4v: Chip of thermoelectric conversion material
4a: Chip of N-type thermoelectric conversion material
4b: Chip of P-type thermoelectric conversion material
5a, 5b: Concave on the upper surface of chip of thermoelectric conversion material
11: substrate
12: Pattern frame
12': Stainless steel
13s: Aperture
13d: Opening depth (pattern frame thickness)
13: Opening
14a: N-Type thermoelectric conversion material layer
14b: P-Type thermoelectric conversion material layer
X: Length (width direction)
Xmax: Maximum value of length in the width direction (longitudinal section)
Y: Length (depth direction)
D: Thickness (thickness direction)
Dmax: Maximum value of thickness in the thickness direction (longitudinal section)
S: Area of longitudinal section
T: Deepest part (concave)
Tmax: Maximum value of depth of concave (longitudinal section)

The invention claimed is:

1. A chip of thermoelectric conversion material comprising a concavity on at least one surface of the chip of thermoelectric conversion material,
wherein in a longitudinal section including a central part in a width direction of the chip of thermoelectric conversion material, when the area of the longitudinal section is defined as S ($\mu m^2$), a maximum value of the thickness in the thickness direction of the longitudinal section is defined as Dmax ($\mu m$), a maximum value of the length in the width direction of the longitudinal section is defined as Xmax ($\mu m$), and a maximum value of the depth of the concavity of the longitudinal section is defined as Tmax ($\mu m$), the cross section of the concavity of the longitudinal section of the chip of thermoelectric conversion material is satisfied with the following requirement (A) and requirement (B):

$$0 < (Dmax \times Xmax - S)/(Dmax \times Xmax) \leq 0.20 \quad (A)$$

$$0.01 < Tmax/Dmax < 0.30 \text{ and } Tmax \geq 2 \, \mu m \quad (B)$$

wherein,
in the longitudinal section of the chip of thermoelectric conversion material, the maximum value Dmax of the thickness in the thickness direction of the longitudinal section means a maximum distance (thickness) between two points of intersection obtained on the occasion when in standing a perpendicular line on the bottom of the longitudinal section, the top and bottom ends of the thickness in the thickness direction of the longitudinal section intersect with the perpendicular line: the maximum value Xmax of the length in the width direction of the longitudinal section means a maximum distance (length) between two points of intersection obtained on the occasion when in drawing a parallel line parallel to the bottom of the longitudinal section, the left and right ends of the length in the width direction of the longitudinal section intersect with the parallel line; and the maximum value Tmax of the depth of the concavity of the longitudinal section means a maximum distance (depth) obtained by subtracting a shortest distance (length) between a deepest part of the concavity and a point of intersection obtained on the occasion of dropping a perpendicular line on the bottom of the longitudinal section from the deepest part of the concavity, from the maximum value Dmax of the thickness in the thickness direction of the longitudinal section.

2. The chip of claim 1, wherein the shape of the chip of thermoelectric conversion material is at least one selected from a rectangular parallelepiped shape, a cubic shape, and a columnar shape.

3. The chip of claim 1, wherein the requirement (A) is $0.05 < (Dmax \times Xmax - S)/(Dmax \times Xmax) \leq 0.10$; and the requirement (B) is $0.01 < Tmax/Dmax < 0.20$ and $4 \leq Tmax \leq 35$ $\mu m$.

4. The chip of claim 1, comprising a joining material layer in the concavity of the chip of thermoelectric conversion material.

5. The chip of claim 4, wherein the joining material layer is formed of a solder material, a conductive adhesive, or a sintered joining agent.

6. A thermoelectric conversion module, comprising: a chip of thermoelectric conversion material comprising a concavity on at least one surface of the chip of thermoelectric conversion material,
wherein in a longitudinal section including a central part in a width direction of the chip of thermoelectric conversion material, when the area of the longitudinal section is defined as S ($\mu m^2$), a maximum value of the thickness in the thickness direction of the longitudinal section is defined as Dmax ($\mu m$), a maximum value of the length in the width direction of the longitudinal section is defined as Xmax ($\mu m$), and a maximum value of the depth of the concavity of the longitudinal section is defined as Tmax ($\mu m$), the cross section of the concavity of the longitudinal section of the chip of thermoelectric conversion material is satisfied with the following requirement (A) and requirement (B):

$$0 < (Dmax \times Xmax - S)/(Dmax \times Xmax) \leq 0.20 \quad (A)$$

$$0.01 < Tmax/Dmax < 0.30 \text{ and } Tmax \geq 2 \, \mu m \quad (B)$$

wherein,
in the longitudinal section of the chip of thermoelectric conversion material, the maximum value Dmax of the thickness in the thickness direction of the longitudinal section means a maximum distance (thickness) between two points of intersection obtained on the occasion when in standing a perpendicular line on the bottom of the longitudinal section, the top and bottom ends of the thickness in the thickness direction of the longitudinal section intersect with the perpendicular line; the maximum value Xmax of the length in the width direction of the longitudinal section means a maximum distance (length) between two points of intersection obtained on the occasion when in drawing a parallel line parallel to the bottom of the longitudinal section, the left and right ends of the length in the width direction of the longitudinal section intersect with the parallel line; and the maximum value Tmax of the depth of the concavity of the longitudinal section means a maximum distance (depth) obtained by subtracting a shortest distance (length) between a deepest part of the concavity and a point of intersection obtained on the occasion of dropping a perpendicular line on the bottom of the longitudinal section from the deepest part of the concavity, from the maximum value Dmax of the thickness in the thickness direction of the longitudinal section.

\* \* \* \* \*